(12) United States Patent
Nakamura

(10) Patent No.: US 12,185,509 B2
(45) Date of Patent: Dec. 31, 2024

(54) POWER CONVERSION DEVICE

(71) Applicant: TMEIC Corporation, Chuo-ku (JP)

(72) Inventor: Koki Nakamura, Chuo-ku (JP)

(73) Assignee: TMEIC Corporation, Chuo-ku (JP)

( * ) Notice: Subject to any disclaimer, the term of this patent is extended or adjusted under 35 U.S.C. 154(b) by 138 days.

(21) Appl. No.: 18/040,469

(22) PCT Filed: Jul. 5, 2021

(86) PCT No.: PCT/JP2021/025354
§ 371 (c)(1),
(2) Date: Feb. 3, 2023

(87) PCT Pub. No.: WO2023/281601
PCT Pub. Date: Jan. 12, 2023

(65) Prior Publication Data
US 2023/0337404 A1 Oct. 19, 2023

(51) Int. Cl.
*H05K 7/20* (2006.01)
*H02M 7/00* (2006.01)
*H02J 9/06* (2006.01)

(52) U.S. Cl.
CPC ........ *H05K 7/20909* (2013.01); *H02M 7/003* (2013.01); *H05K 7/20145* (2013.01); *H05K 7/20172* (2013.01); *H02J 9/062* (2013.01)

(58) Field of Classification Search
CPC ... G06F 1/189; G06F 1/30; G06F 1/20; G06F 1/188; G06F 1/181; G06F 1/206;
(Continued)

(56) References Cited

U.S. PATENT DOCUMENTS 7,031,153 B2 * 4/2006 Tanaka .................. G11B 33/142
361/679.48
7,379,305 B2 * 5/2008 Briggs ..................... H05K 7/18
361/727
(Continued)

FOREIGN PATENT DOCUMENTS

| JP | 2007-74865 A | 3/2007 |
|---|---|---|
| JP | 2007-174851 A | 7/2007 |
| JP | 2016-115894 A | 6/2016 |

OTHER PUBLICATIONS

International Search Report issued Sep. 14, 2021 in PCT/JP2021/025354, filed on Jul. 5, 2021, 2 pages.

*Primary Examiner* — Mandeep S Buttar
(74) *Attorney, Agent, or Firm* — Oblon, McClelland, Maier & Neustadt, L.L.P.

(57) ABSTRACT

A partition member is disposed in a space portion between a rear surface of a housing and outer surfaces of a plurality of units. A first partition portion is disposed in a boundary portion between two units adjacent to each other in a vertical direction and extends in a right-left direction. A second partition portion and a third partition portion each are connected to a corresponding one of both ends of the first partition portion in the right-left direction and extend toward the upper surface. Air discharged from a first unit group located above the first partition portion is guided to flow through a first air channel to the upper surface. Air discharged from a second unit group located below the first partition portion is guided to flow through a second air channel to the upper surface.

7 Claims, 7 Drawing Sheets

(58) Field of Classification Search
CPC .... G06F 1/26; H05K 7/1492; H05K 7/20145; H05K 7/14325; H05K 7/20736; H05K 7/1457; H05K 7/20572; H05K 7/20172; H05K 7/20909; H05K 7/20918; H05K 5/0213; H05K 7/20136; H05K 7/20009; H02J 9/06
USPC ......................................................... 361/695
See application file for complete search history.

(56) References Cited

U.S. PATENT DOCUMENTS

| | | | | |
|---|---|---|---|---|
| 7,420,805 | B2* | 9/2008 | Smith | H05K 7/1488 |
| | | | | 361/679.48 |
| 9,462,707 | B2* | 10/2016 | Wright | H05K 7/20945 |
| 2008/0043426 | A1* | 2/2008 | Nishiyama | G06F 1/20 |
| | | | | 361/679.5 |
| 2013/0021696 | A1* | 1/2013 | Davis | H05K 7/20772 |
| | | | | 360/97.13 |
| 2014/0160686 | A1* | 6/2014 | Benson | H05K 7/2089 |
| | | | | 361/724 |
| 2014/0177170 | A1* | 6/2014 | Steffen | G08B 17/00 |
| | | | | 361/692 |
| 2016/0316586 | A1* | 10/2016 | Lai | H02J 3/1842 |
| 2017/0108900 | A1* | 4/2017 | Chou | G06F 1/20 |
| 2022/0264773 | A1* | 8/2022 | Steidl | H05K 7/20572 |
| 2023/0229214 | A1* | 7/2023 | Vivio | G06F 1/20 |
| | | | | 713/300 |

* cited by examiner

POWER CONVERSION DEVICE

TECHNICAL FIELD

The present disclosure relates to a power conversion device.

BACKGROUND ART

There is a power conversion device in which a plurality of units stacked in a vertical direction are accommodated in a housing having a rectangular parallelepiped shape. Such a power conversion device is generally configured to cause cooling air to flow through the housing to thereby cool the plurality of units. In the power conversion device, an air channel through which air flows is provided on the rear surface side of the plurality of units. The air having cooled each unit is discharged through the air channel to the outside of the housing. In the above-described configuration, however, the amount of air flow becomes unbalanced depending on the position where the units are accommodated. This causes a problem that the cooling performance decreases in the units for which the amount of air flow is relatively small.

As means for solving the above-described problem, for example, Japanese Patent Laying-Open No. 2007-74865 (PTL 1) discloses a power conversion device having a configuration in which a plurality of semiconductor conversion units divided into right and left two rows are accommodated in a housing and cooling air is caused to flow through the housing to thereby air-cool each of the semiconductor conversion units. In PTL 1, vertical air channels are provided on the rear surface of each of the plurality of semiconductor conversion units divided into right and left two rows such that the vertical air channels extend in the vertical direction along the respective rows.

The housing has a ceiling equipped with two cooling fans corresponding to the respective air channels.

Further, Japanese Patent Laying-Open No. 2016-115894 (PTL 2) discloses a housing structure of a power conversion device equipped with a plurality of semiconductor units that are stacked in multiple stages. In this housing structure, the plurality of semiconductor units are divided into: a first group including odd-numbered semiconductor units counted from the uppermost stage; and a second group including even-numbered semiconductor units counted from the uppermost stage. In order to allow cooling air to flow through each of the semiconductor units, a first air channel and a second air channel corresponding to the first group and the second group, respectively, are provided. On the rear surface side of the housing, the first and second air channels are arranged side by side in the right-left direction of the housing.

CITATION LIST

Patent Literature

PTL 1: Japanese Patent Laying-Open No. 2007-74865
PTL 2: Japanese Patent Laying-Open No. 2016-115894

SUMMARY OF INVENTION

Technical Problem

In the power conversion device disclosed in PTL 1, two air channels corresponding to their respective semiconductor units in the right and left two rows are arranged side by side in the right-left direction, so that the housing increases in length in the right-left direction, which leads to a concern that the installation area of the housing increases.

In the housing structure disclosed in PTL 2, the plurality of semiconductor units stacked in line are mounted. Thus, the length of the housing in the right-left direction can be reduced as compared with that in PTL 1. On the other hand, the cooling air flows through each of the semiconductor units one-sidedly on one of the right and left sides toward one of the first and second air channels. This leads to a concern that the cooling performance of each semiconductor unit may decrease.

The present disclosure has been made to solve the above-described problems. An object of the present disclosure is to improve the cooling performance of a plurality of units provided in a power conversion device without increasing an installation area of a housing in which the plurality of units stacked in a vertical direction are accommodated.

Solution to Problem

A power conversion device according to one aspect of the present disclosure includes: a housing having a rectangular parallelepiped shape; a plurality of units stacked in a vertical direction and accommodated in the housing; a plurality of fan units disposed on an upper surface of the housing; and a partition member. The partition member is disposed in a space portion provided between a rear surface of the housing and outer surfaces of the units. Each of the units incorporates a fan. The fan introduces air into a corresponding unit of the units and discharges the introduced air toward the space portion. The partition member includes a first partition portion, a second partition portion, and a third partition portion. The first partition portion is disposed in a boundary portion between two units adjacent to each other in the vertical direction among the units, and extends in a right-left direction of the housing. The second partition portion and the third partition portion each are connected to a corresponding one of both ends of the first partition portion in the right-left direction and extend toward the upper surface of the housing. A space between an inner surface of the housing and outer surfaces of the units is defined by the partition member, and a first air channel and a second air channel are provided in the space. Air discharged from a first unit group located above the first partition portion is guided through the first air channel to the upper surface of the housing. Air discharged from a second unit group located below the first partition portion is guided through the second air channel to the upper surface of the housing. The fan units include a first fan unit, a second fan unit, and a third fan unit. The first fan unit is located at a downstream end of the first air channel. The second fan unit and the third fan unit are located at a downstream end of the second air channel.

Advantageous Effects of Invention

According to the present disclosure, in the power conversion device including a plurality of units stacked in the vertical direction and accommodated in the housing, the cooling performance of the plurality of units can be improved without increasing the installation area of the housing.

DESCRIPTION OF EMBODIMENTS

Figure 1:
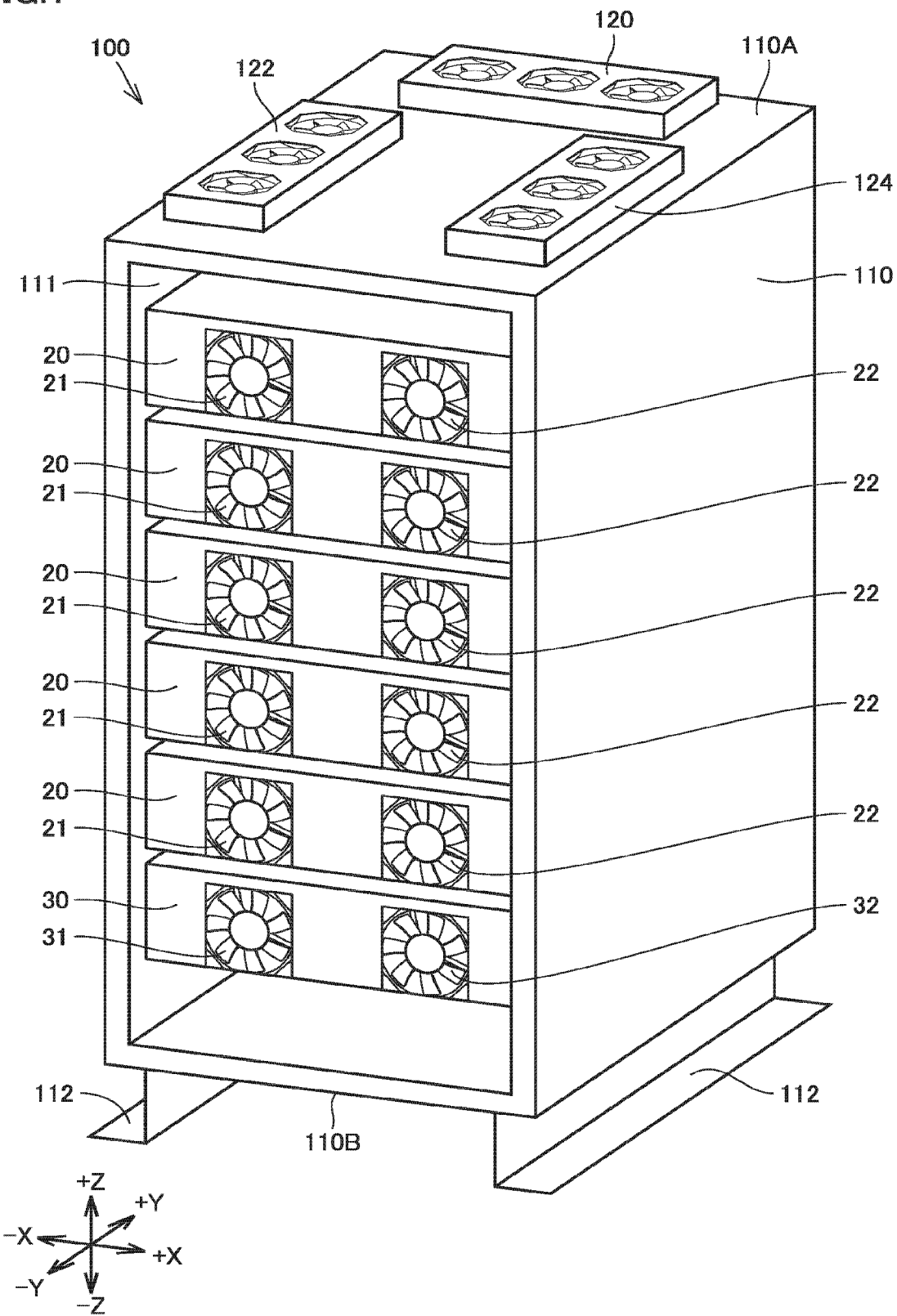
FIG. 1 is a schematic external view showing a configuration example of a power conversion device according to an embodiment.

The following describes embodiments of the present disclosure in detail with reference to the accompanying drawings. In the following description, the same or corresponding portions are denoted by the same reference characters, and description thereof will not be basically repeated.

FIG. 1 is a schematic external view showing a configuration example of a power conversion device according to an embodiment. FIG. 1 shows an internal configuration of the power conversion device from which a front cover of a housing has been removed. The power conversion device according to the present embodiment is applicable to, for example, an uninterruptible power supply device.

An uninterruptible power supply device 100 is connected between an alternating-current (AC) power supply (not shown) such as a commercial power supply and a load (not shown). In the normal state (when the AC power supply normally operates), uninterruptible power supply device 100 uses the AC power supplied from the AC power supply to thereby supply electric power to the load. When a power failure occurs in the AC power supply, uninterruptible power supply device 100 uses direct-current (DC) power supplied from a power storage device (not shown) to thereby supply electric power to the load.

As shown in FIG. 1, uninterruptible power supply device 100 includes a housing 110 having a board shape (a rectangular parallelepiped shape), a plurality of units 20 and 30, and a plurality of fan units 120, 122, and 124. In the following description, it is assumed that an X-axis direction extends in the right-left direction (the horizontal direction) when housing 110 is viewed from the front side, a Y-axis direction extends in the anteroposterior direction, and a Z-axis direction extends in the vertical direction. Note that a +X-direction extends in the direction directed rightward in the X-axis direction while a −X-direction extends in the direction opposite to the +X-direction. Also, a +Y-direction extends in the direction directed from the front side to the rear side of uninterruptible power supply device 100 while a −Y-direction extends in the direction opposite to the +Y-direction. Further, a +Z-direction extends in the direction directed upward in the Z-axis direction while a −Z-direction extends in the direction opposite to the +Z-direction.

Housing 110 has an upper surface 110A and a lower surface 110B. Lower surface 110B of housing 110 is supported by a pair of legs 112. Housing 110 accommodates a plurality of units 20 and 30. Housing 110 includes an opening 111 that opens in the −Y-direction, and a front cover (not shown) that covers opening 111. The front cover is provided such that opening 111 can be opened and closed. The front cover is provided with air vents through which air on the outside of housing 110 is introduced into housing 110.

The plurality of units 20 and 30 each have a substantially rectangular parallelepiped shape and are stacked at intervals in the Z-axis direction. From outside housing 110, the plurality of units 20 and 30 are inserted through opening 111 into housing 110. Each of the plurality of units 20 and 30 is provided to be insertable and removable in the Y-axis direction so as to facilitate maintenance and replacement with new products.

The plurality of units 20, 30 include a plurality of uninterruptible power supply (UPS) units 20 and a bypass unit 30. The number of UPS units 20 is not limited to five. The number of bypass units 30 is not limited to one.

UPS unit 20 has a front surface provided with an air vent 21 and a rear surface provided with an air vent. UPS unit 20 incorporates a fan 22 by which air is introduced through the front surface of UPS unit 20 and discharged through the rear surface of UPS unit 20. Bypass unit 30 has a front surface provided with an air vent 31 and a rear surface provided with an air vent. Bypass unit 30 incorporates a fan 32 by which air is introduced through the front surface of bypass unit 30 and discharged through the rear surface of bypass unit 30. The number of fans incorporated in each unit is not limited to two.

Fan units 120, 122, and 124 are disposed on upper surface 110A of housing 110. Each of fan units 120, 122, and 124 introduces air inside housing 110, and discharges the introduced air to the outside of housing 110. Thereby, air is introduced into housing 110 through the air vent of the front cover of housing 110, and the introduced air flows through the plurality of units 20 and 30, to thereby promote dissipation of heat from the plurality of units 20 and 30. The air heated after having flowed through the plurality of units 20 and 30 is discharged through upper surface 110A of housing 110 to the outside of housing 110.

Figure 2:
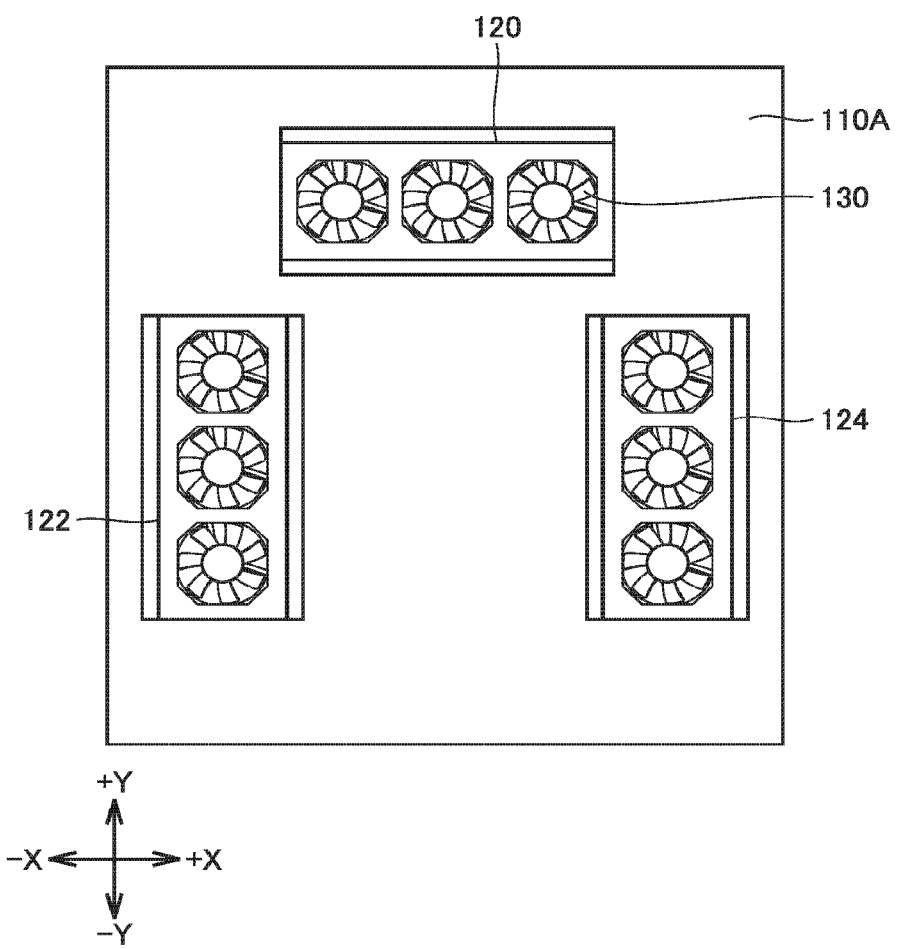
FIG. 2 is a top view of an uninterruptible power supply device shown in FIG. 1.

FIG. 2 is a top view of uninterruptible power supply device 100 shown in FIG. 1.

As shown in FIG. 2, on upper surface 110A, fan unit 120 is disposed on the rear surface side, and fan units 122 and 124 are disposed on the front surface side. Fan units 122 and 124 each are disposed at a corresponding one of both ends of housing 110 in the right-left direction. When housing 110 is viewed from the front side, fan unit 122 is disposed on the left side and fan unit 124 is disposed on the right side.

Each of fan units 120, 122, 124 includes a plurality of fans 130. The plurality of fans 130 are arranged side by side on upper surface 110A of housing 110. Fan unit 120 includes three fans 130 arranged side by side in the X-axis direction. Each of fan units 122 and 124 includes three fans 130 arranged side by side in the Y-axis direction.

In the example in FIG. 2, each of fan units 120, 122, and 124 includes three fans 130, but the number of fans 130 may be changed as appropriate according to the amount of air flow required for cooling the plurality of units 20 and 30. Further, fan units 120, 122, and 124 may not have the same number of fans 130.

Figure 3:
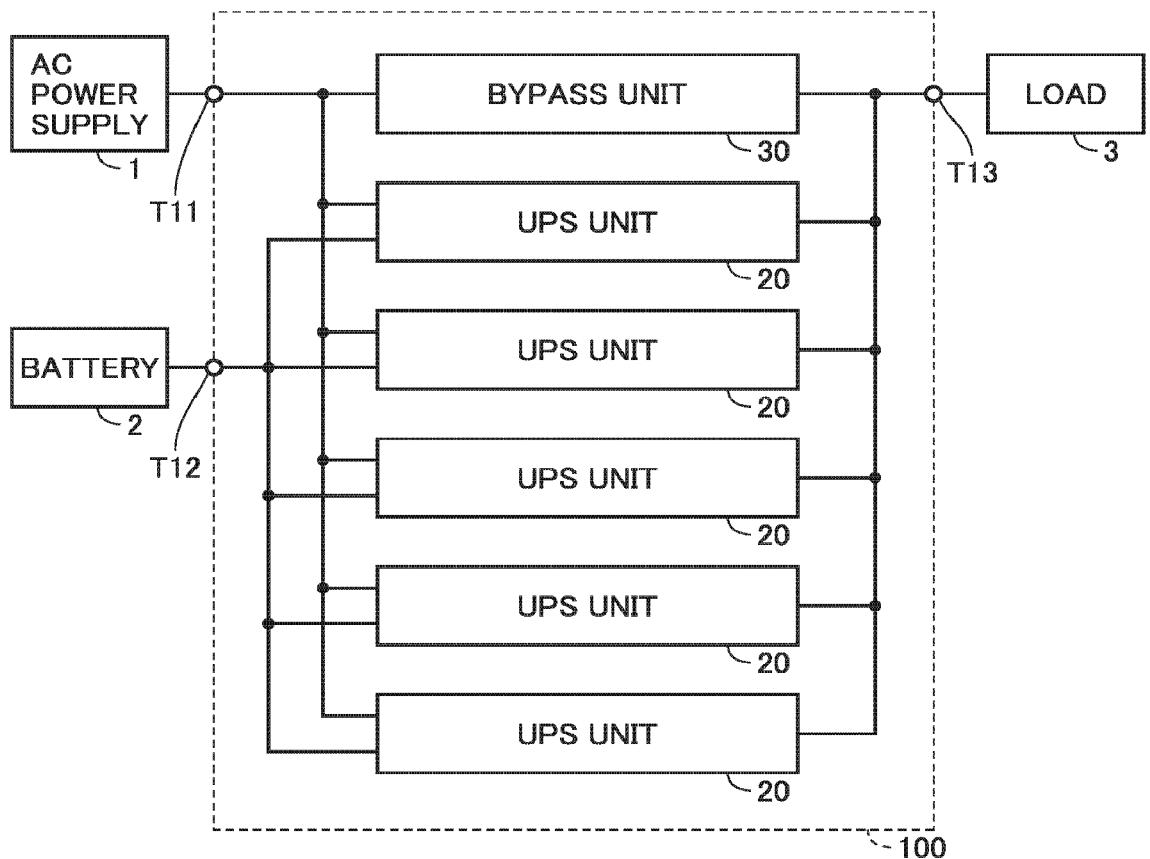
FIG. 3 is a circuit block diagram showing a configuration of the uninterruptible power supply device.

FIG. 3 is a circuit block diagram showing the configuration of uninterruptible power supply device 100.

As shown in FIG. 3, uninterruptible power supply device 100 includes an input terminal T11, a battery terminal T12, an output terminal T13, the plurality of UPS units 20, and bypass unit 30. Input terminal T11 is connected to an AC power supply 1 and receives AC power having a commercial AC frequency. Output terminal T13 is connected to a load 3. Battery terminal T12 is connected to a battery 2. Battery 2 corresponds to one example of the "power storage device".

The plurality of UPS units 20 and bypass unit 30 are connected in parallel between input terminal T11 and output terminal T13.

Figure 4:
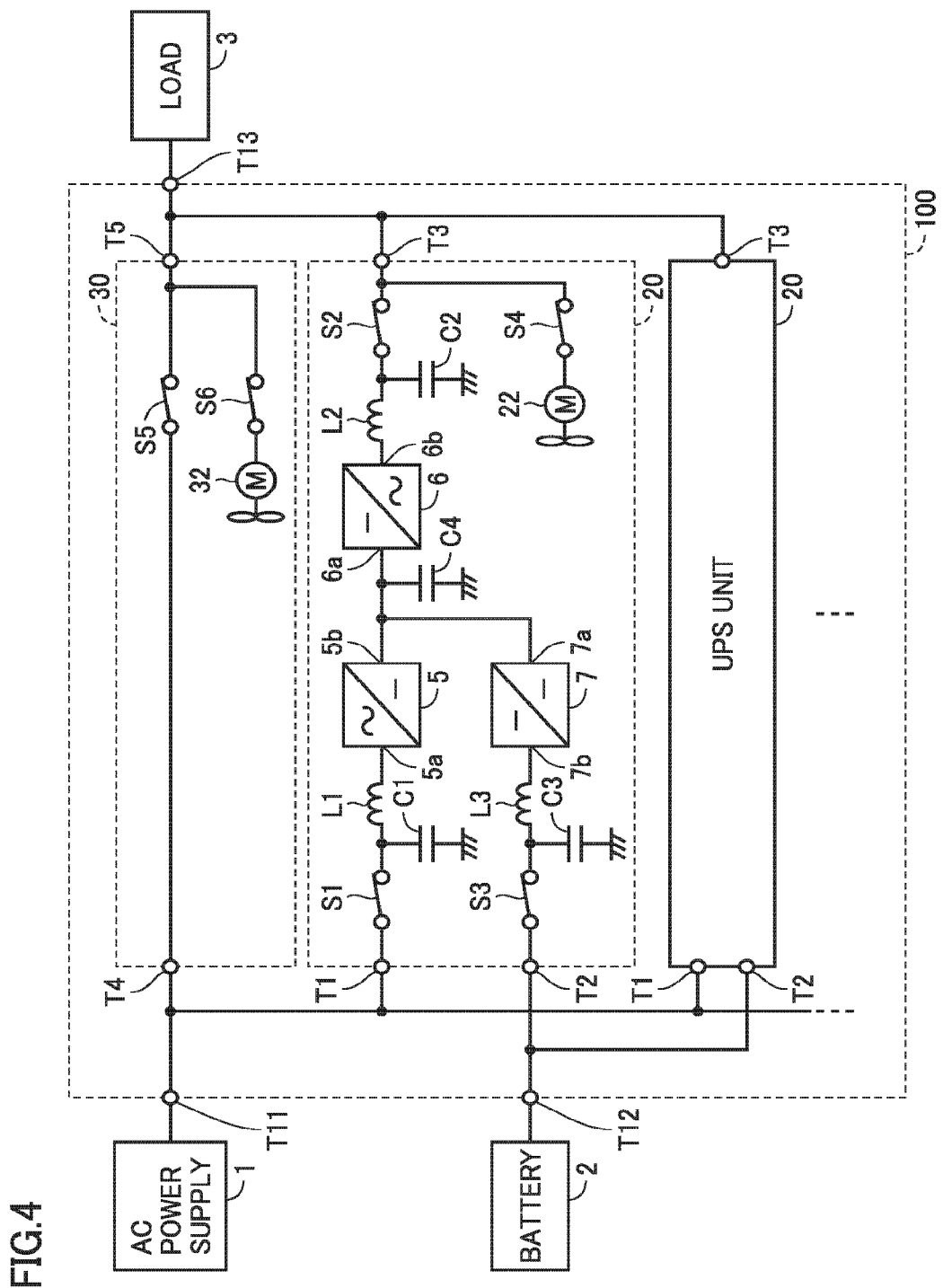
FIG. 4 is a circuit block diagram showing a configuration example of a UPS unit and a bypass unit.

FIG. 4 is a circuit block diagram showing a configuration example of UPS units 20 and bypass unit 30.

As shown in FIG. 4, UPS unit 20 includes an input terminal T1, an output terminal T3, a battery terminal T2, switches S1 to S4, capacitors C1 to C4, reactors L1 to L3, a converter 5, an inverter 6, a bidirectional chopper 7, and a fan 22.

Terminals T1, T2, and T3 are connected to terminals T11, T12, and T13, respectively. Switch S1 and reactor L1 are connected in series between input terminal T1 and an input node 5a of converter 5. Capacitor C1 is connected between a reference voltage line and a node between switch S1 and reactor L1. Switch S1 is turned on in the normal state and turned off, for example, during maintenance of UPS unit 20. Capacitor C1 and reactor L1 constitute an AC input filter (a low-pass filter) that allows the AC power from AC power supply 1 to flow through converter 5 and suppresses leakage of a signal having a carrier frequency generated in converter 5 to the AC power supply 1 side.

Converter 5 converts AC power from AC power supply 1 into DC power. Capacitor C4 is connected between an output node 5b of converter 5 and the reference voltage line, and smoothes the output voltage from converter 5. Output node 5b of converter 5, an input node 6a of inverter 6, and a first node 7a of bidirectional chopper 7 are connected to each other. Inverter 6 converts the DC power from converter 5 or bidirectional chopper 7 into AC power having a commercial frequency.

Reactor L2 and switch S2 are connected in series between an output node 6b of inverter 6 and output terminal T3. Capacitor C2 is connected between a reference voltage line and a node between reactor L2 and switch S2. Reactor L2 and capacitor C2 constitute an AC output filter (a low-pass filter) that allows the AC power from inverter 6 to flow through load 3 and suppresses leakage of a signal having a carrier frequency generated in inverter 6 to the load 3 side.

Switch S2 is turned on in an inverter power feed mode in which the AC power generated in inverter 6 is supplied to load 3, and turned off in a bypass power feed mode in which the AC power from AC power supply 1 is supplied to load 3 through bypass unit 30. Further, switch S2 is turned off during maintenance or failure of UPS unit 20.

Switch S3 and reactor L3 are connected in series between battery terminal T2 and a second node 7b of bidirectional chopper 7. Capacitor C3 is connected between a reference voltage line and a node between switch S3 and reactor L3. Switch S3 is turned on in the normal state and turned off, for example, during maintenance of UPS unit 20 or battery 2. Capacitor C3 and reactor L3 constitute a low-pass filter that allows DC power to flow therethrough and suppresses leakage of a signal having a carrier frequency generated in bidirectional chopper 7 to the battery 2 side.

Bidirectional chopper 7 supplies the DC power generated in converter 5 to battery 2 in the normal state in which AC power is supplied from AC power supply 1, and supplies the DC power from battery 2 to inverter 6 in a power failure state in which supply of the AC power from AC power supply 1 is stopped.

Switch S4 is connected between output terminal T3 and fan 22. Switch S4 is turned on in the normal state and turned off, for example, during maintenance of UPS unit 20.

The following simply describes the operation of UPS unit 20. In the normal state in which AC power is supplied from AC power supply 1, the AC power is converted by converter 5 into DC power. The DC power is converted by inverter 6 into AC power, and then, supplied to load 3 and stored in battery 2 by bidirectional chopper 7.

When a power failure occurs and supply of the AC power from AC power supply 1 is stopped, the operation of converter 5 is stopped, and the DC power from battery 2 is supplied to inverter 6 by bidirectional chopper 7 and converted into AC power by inverter 6, and then, the converted AC power is supplied to load 3. Thus, even when a power failure occurs, the operation of load 3 can be continued during a time period in which DC power is stored in battery 2.

Bypass unit 30 includes an input terminal T4, an output terminal T5, switches S5 and S6, and fan 32. Terminals T4 and T5 are connected to terminals T11 and T13, respectively. Switch S5 is connected between terminals T4 and T5. Switch S5 is turned on in a bypass power feed mode and turned off in an inverter power feed mode. Switch S6 is connected between output terminal T3 and fan 32. Switch S6 is turned on in the bypass power feed mode and turned off in the inverter power feed mode.

As described above, uninterruptible power supply device 100 includes the plurality of UPS units 20 and bypass unit 30 connected in parallel between AC power supply 1 and load 3. Therefore, the number of UPS units 20 and bypass unit 30 connected in parallel can be adjusted according to the size of load 3, with the result that various loads can be readily supported.

As described above, the plurality of UPS units 20 and bypass unit 30 are cooled by passage of the air through each of these units that has been introduced into housing 110 through the air vents of the front cover of housing 110. The air heated after having flowed through each unit is discharged from upper surface 110A of housing 110 to the outside of housing 110.

Then, a cooling structure of uninterruptible power supply device 100 will be described with reference to FIGS. 5 to 7.

Figure 5:
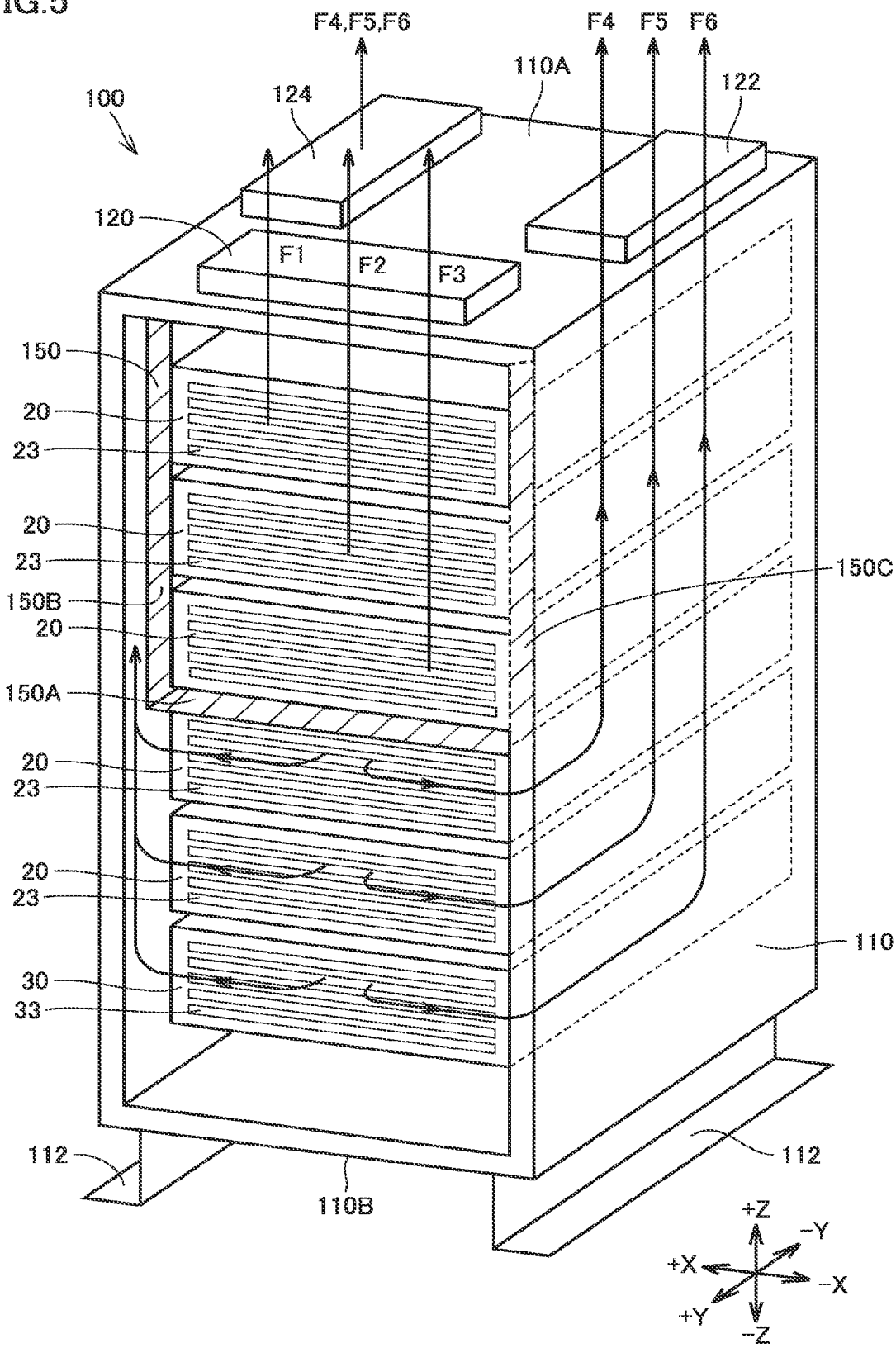
FIG. 5 is an external view schematically showing the uninterruptible power supply device shown in FIG. 1, which is viewed from behind.

FIG. 5 is an external view schematically showing uninterruptible power supply device 100 shown in FIG. 1, which is viewed from behind. FIG. 6 is a rear view of uninterruptible power supply device 100 shown in FIG. 1, which is viewed from behind. FIG. 7 is a side view of uninterruptible power supply device 100 shown in FIG. 1, which is viewed laterally.

As shown in FIG. 5, the rear surface of UPS unit 20 is provided with an air vent 23. During the operation of fan 22 (FIG. 1) incorporated in UPS unit 20, air is introduced into UPS unit 20 through air vents 21 (FIG. 1) in the front surface of UPS unit 20. The introduced air passes through UPS unit 20 and is then discharged from air vents 23.

The rear surface of bypass unit 30 is provided with an air vent 33. During the operation of fan 32 (FIG. 1) incorporated in bypass unit 30, air is introduced into bypass unit 30 through air vents 31 (FIG. 1) in the front surface of bypass unit 30. The introduced air passes through bypass unit 30, and is then discharged from air vents 33.

Each of arrows F1 to F6 in each of the figures schematically shows the flow of air introduced into each unit and discharged from each unit. The air discharged from each unit flows toward upper surface 110A of housing 110 through a space provided between the inner surface of housing 110 and the outer surfaces of the plurality of units 20 and 30. The air having reached upper surface 110A is discharged through fan units 120, 122, and 124 to the outside of housing 110.

A partition member 150 is provided in a space between the inner surface of housing 110 and the outer surfaces of the plurality of units 20 and 30. As shown in FIG. 7, partition member 150 is disposed in a space portion 140 provided between a rear surface 110C of housing 110 and the rear surfaces of the plurality of units 20 and 30.

As shown in FIG. 5, partition member 150 includes: a partition plate 150A extending in the X-axis direction to partition space portion 140 in the Z-axis direction; and partition plates 150B and 150C extending in the Z-axis direction to partition space portion 140 in the X-axis direction. Partition plate 150A corresponds to one example of the "first partition portion", partition plate 150B corresponds to one example of the "second partition portion", and partition plate 150C corresponds to one example of the "third partition portion".

When the plurality of units 20 and 30 are configured in six stages as shown in FIG. 5, partition plate 150A is disposed, for example, in a boundary portion between UPS units 20 in the third and fourth stages counted from lower surface 110B. It should be noted that partition plate 150A does not necessarily have to be disposed at this position but can be disposed in a boundary portion between any units in two stages adjacent to each other in the Z-axis direction.

In the example in FIG. 5, partition plate 150A divides the plurality of units 20 and 30 into: a first unit group including units of three stages located on the upper surface 110A side; and a second unit group including units of three stages located below the first unit group. Note that the number of units included in the first unit group may not be the same as the number of units included in the second unit group. In other words, depending on the position where partition plate 150A is disposed, the number of units included in the first unit group can be different from the number of units included in the second unit group.

Partition plate 150B has: a first end portion in the Z-axis direction that is connected to the first end portion of partition plate 150A in the X-axis direction; and a second end portion in the Z-axis direction that is connected to upper surface 110A. Partition plate 150C has: a first end portion in the Z-axis direction that is connected to the second end portion of partition plate 150A in the X-axis direction; and a second end portion in the Z-axis direction that is connected to upper surface 110A. Partition plates 150B and 150C each extend in the Z-axis direction.

Figure 7:
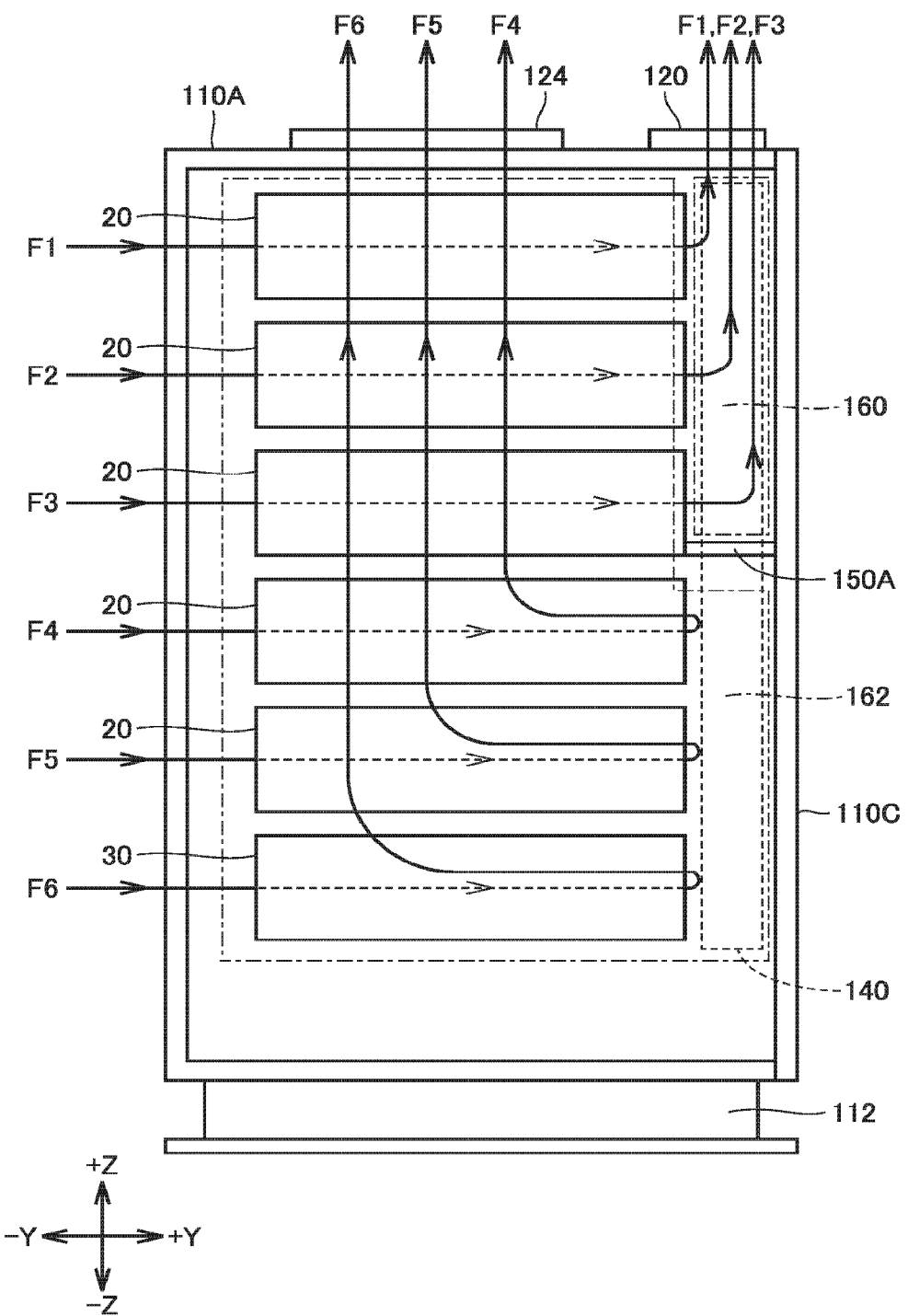
FIG. 7 is a side view of the uninterruptible power supply device shown in FIG. 1, which is viewed laterally.

By partition member 150, two air channels 160 and 162 are provided inside housing 110 such that the air discharged from each of the rear surfaces of the plurality of units 20 and 30 is guided to upper surface 110A, as shown in FIG. 7. Air channel 160 is defined by the space defined by partition member 150 in space portion 140. Fan unit 120 is located at the downstream end of air channel 160. Air channel 160 corresponds to one example of the "first air channel", and fan unit 120 corresponds to one example of the "first fan unit".

By the configuration as described above, the air discharged from each of the rear surfaces of UPS units 20 (the first unit group) in the fourth to sixth stages is guided through air channel 160 to upper surface 110A and then discharged through fan unit 120 to the outside of housing 110, as shown by arrows F1 to F3 in each of the figures.

Air channel 162 is defined by: a space outside the space defined by partition member 150 in space portion 140; and space portions 142, 144 (see FIG. 6) between side surfaces 110D, 110E of housing 110 and the side surfaces of the plurality of units 20 and 30. Fan units 122 and 124 are located at the downstream end of air channel 162. Air channel 162 corresponds to one example of the "second air channel", fan unit 122 corresponds to one example of the "second fan unit", and fan unit 124 corresponds to one example of the "third fan unit".

By the configuration as described above, the air discharged from each of the rear surfaces of bypass unit 30 in the first stage to UPS unit 20 (the second unit group) in the third stage is guided through air channel 162 to upper surface 110A and then discharged through fan units 122 and 124 to the outside of housing 110, as shown by arrows F4 to F6 in each of the figures.

Figure 6:
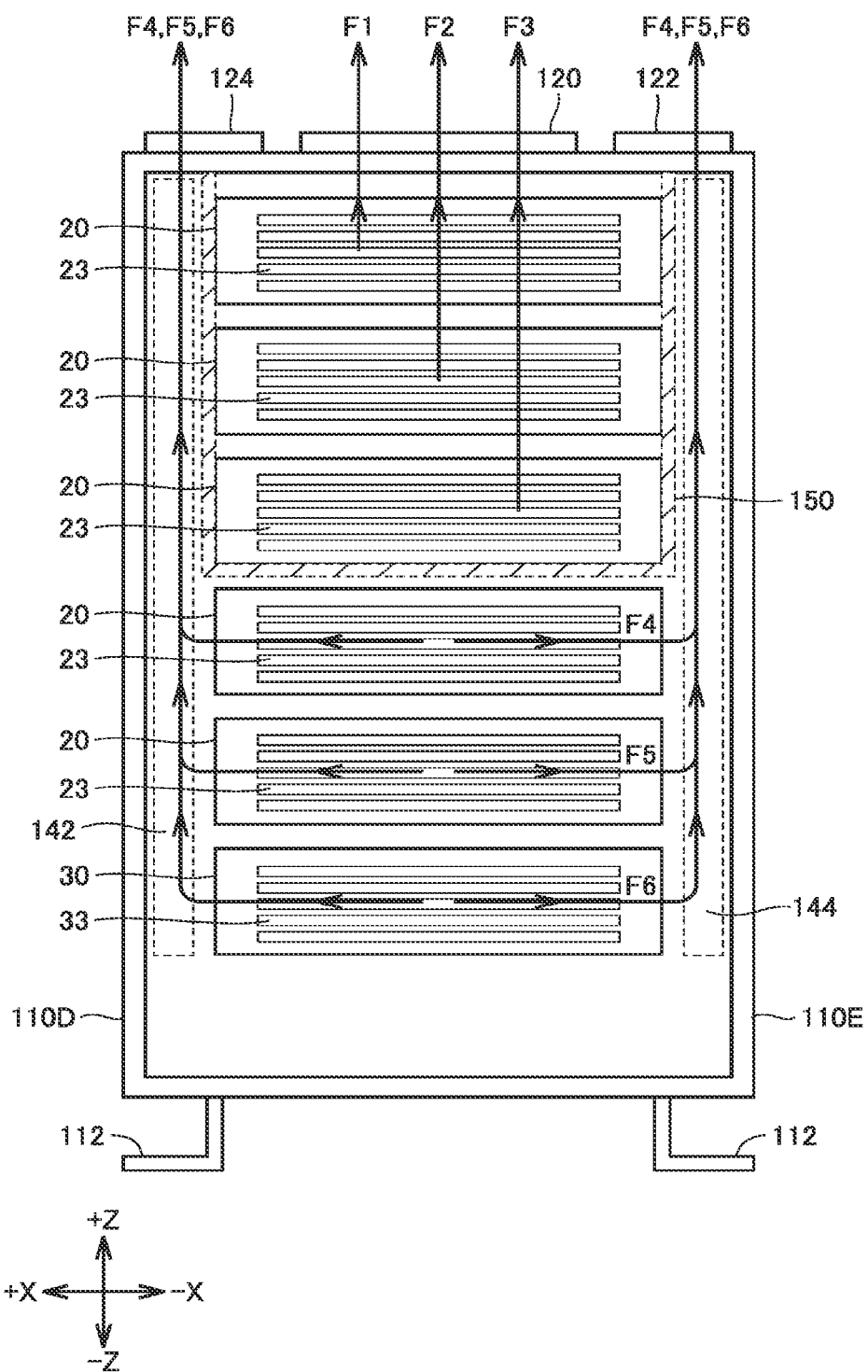
FIG. 6 is a rear view of the uninterruptible power supply device shown in FIG. 1, which is viewed from behind.

Specifically, as shown in FIG. 6, the air discharged from the rear surface of each of bypass unit 30 in the first stage to UPS unit 30 in the third stage is split to flow in the +X-axis direction and the −X-axis direction. The split flows of air in these two directions are guided through space portions 142 and 144 to upper surface 110A, and then discharged through fan units 124 and 122 to the outside of housing 110.

As described above, in the present embodiment, in uninterruptible power supply device 100 in which the plurality of units 20 and 30 stacked in the vertical direction are accommodated in housing 110, partition member 150 (partition plate 150A) provided in space portion 140 inside housing 110 divides the plurality of units 20 and 30 into: the first unit group including at least one unit 20 located on the upper surface 110A side; and the second unit group including at least one unit 20, 30 located below the first unit group.

In the above-described configuration, the space between the inner surface of housing 110 and the outer surfaces of the plurality of units 20 and 30 includes: air channel 160 (the first air channel) through which the air discharged from the first unit group flows; and air channel 162 (the second air channel) through which the air discharged from the second unit group flows. Air channel 160 and air channel 162 are defined by partition member 150. Air channel 160 is defined by space portion 140 facing the rear surface of the first unit group. Air channel 162 is defined by: space portion 140 facing the rear surface of the second unit group; and space portions 142 and 144 facing each of the side surfaces of the first and second unit groups. Further, on upper surface 110A of housing 110, fan units 120, 122, and 124 are provided for discharging the air having flowed through each of air channels 160 and 162 to the outside of housing 110.

According to the present embodiment, the air discharged from each of the units included in the first and second unit groups can be efficiently guided through air channels 160 and 162 to upper surface 110A of housing 110 and then discharged to the outside of housing 110. In particular, a channel of the air discharged from the second unit group can be ensured, which makes it possible to suppress a decrease in the amount of air flow. This eliminates the need to: accommodate a plurality of units divided into right and left two rows in a housing; and also provide an air channel for each row, as in PTL 1. Therefore, the area in which the housing is installed can be reduced.

Further, according to the present embodiment, one-sided flow of air through each of the plurality of units 20 and 30 as in PTL 2 is avoided.

As a result, according to the present embodiment, the cooling performance of the plurality of units 20 and 30 accommodated in housing 110 can be improved without increasing the area in which housing 110 is installed.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST

1 AC power supply, 2 battery, 3 load, 5 converter, 6 inverter, 7 bidirectional chopper, 20 UPS unit, 21, 23, 31, 33 air vent, 22, 32, 130 fan, 30 bypass unit, 100 uninterruptible power supply device, 110 housing, 110A upper surface, 110B lower surface, 110C rear surface, 110D, 110E side surface, 111 opening, 112 leg, 120, 122, 124 fan unit, 140, 142, 144 space portion, 150 partition member, 150A, 150B, 150C partition plate, 160, 162 air channel.

The invention claimed is:

1. A power conversion device comprising:
a housing having a rectangular parallelepiped shape;
a plurality of units stacked in a vertical direction and accommodated in the housing;
a plurality of fan units disposed on an upper surface of the housing; and
a partition member disposed in a space portion provided between a rear surface of the housing and outer surfaces of the units, wherein
each of the units incorporates a fan that introduces air into a corresponding unit of the units and discharges the introduced air toward the space portion,
the partition member includes
a first partition portion disposed in a boundary portion between two units adjacent to each other in the vertical direction among the units, and extending in a right-left direction of the housing, and
a second partition portion and a third partition portion each connected to a corresponding one of both ends of the first partition portion in the right-left direction and extending toward the upper surface of the housing,
a first air channel and a second air channel defined by the partition member are provided in a space between an inner surface of the housing and the outer surfaces of the units,
air discharged from a first unit group located above the first partition portion is guided through the first air channel to the upper surface of the housing,
air discharged from a second unit group located below the first partition portion is guided through the second air channel to the upper surface of the housing, and
the fan units include
a first fan unit located at a downstream end of the first air channel, and
a second fan unit and a third fan unit each located at a downstream end of the second air channel.

2. The power conversion device according to claim 1, wherein
the first air channel is defined by a space provided in the space portion and defined by the partition member, and the second air channel is defined by a space provided in the space portion and outside the space defined by the partition member, and a space portion between a side surface of the housing and side surfaces of the units.

3. The power conversion device according to claim 1, wherein each of the first fan unit, the second fan unit, and the third fan unit includes a plurality of fans arranged side by side on the upper surface of the housing.

4. The power conversion device according to claim 1, wherein
the first fan unit is disposed on the upper surface of the housing to be close to the rear surface of the housing with respect to the second fan unit and the third fan unit, and
the second fan unit and the third fan unit each are disposed on a corresponding one of both ends of the housing in the right-left direction on the upper surface of the housing.

5. The power conversion device according to claim 1, wherein
each of the units includes
a front surface and a rear surface each provided with an air vent, and
the fan, and
the fan introduces air from the front surface of a corresponding unit of the units and discharges the air from the rear surface of the corresponding unit toward the space portion.

6. The power conversion device according to claim 1, wherein
the power conversion device is an uninterruptible power supply device connected between an AC power supply and a load, and
the units include a plurality of uninterruptible power supply units connected in parallel between the AC power supply and the load.

7. The power conversion device according to claim 6, wherein
each of the uninterruptible power supply units includes
a converter that converts AC power supplied from the AC power supply into DC power, and
an inverter that,
in a normal state in which AC power is supplied from the AC power supply, converts the DC power generated by the converter into AC power, and supplies the converted AC power to the load, and
in a power failure state in which supply of AC power from the AC power supply is stopped, converts DC power stored in a power storage device into AC power and supplies the converted AC power to the load.

* * * * *